United States Patent [19]

Rotolante

[11] Patent Number: 5,561,593
[45] Date of Patent: Oct. 1, 1996

[54] Z-INTERFACE-BOARD

[75] Inventor: Ralph A. Rotolante, Acton, Mass.

[73] Assignee: Vicon Enterprises, Inc., Acton, Mass.

[21] Appl. No.: 187,052

[22] Filed: Jan. 27, 1994

[51] Int. Cl.$^6$ ............................................. H05K 7/02
[52] U.S. Cl. ........................... 361/735; 257/686; 361/790
[58] Field of Search .................... 439/66, 91; 29/830, 29/832, 840, 852; 361/729, 784, 792, 735, 790, 760, 728; 257/686, 700, 448

[56] References Cited

U.S. PATENT DOCUMENTS

| | | | |
|---|---|---|---|
| 3,193,789 | 7/1965 | Brown | 439/45 |
| 4,338,621 | 6/1982 | Braun | 174/52.4 |
| 4,525,921 | 7/1985 | Carson et al. | 29/577 C |
| 4,551,629 | 11/1985 | Carson et al. | 250/578 |
| 4,617,160 | 10/1986 | Belanger et al. | 264/40.1 |
| 4,646,128 | 2/1987 | Carson et al. | 357/74 |
| 4,672,737 | 6/1987 | Carson et al. | 29/572 |
| 4,706,166 | 11/1987 | Go . | |
| 4,727,410 | 2/1988 | Higgins, III | 361/784 |
| 5,015,858 | 5/1991 | Augustine et al. | 250/352 |
| 5,072,331 | 12/1991 | Thiele et al. | 361/380 |
| 5,075,238 | 12/1991 | Solomon | 437/3 |
| 5,092,036 | 3/1992 | Hu et al. | 29/854 |
| 5,096,426 | 3/1992 | Simpson et al. | 439/66 |
| 5,104,820 | 4/1992 | Go et al. | 437/51 |
| 5,111,050 | 5/1992 | Maassen et al. | 250/352 |
| 5,129,142 | 7/1992 | Bindra et al. | 29/852 |
| 5,135,606 | 8/1992 | Kato et al. | 29/876 |
| 5,309,318 | 5/1994 | Beilstein, Jr. | 361/790 |
| 5,374,196 | 12/1994 | Horine | 439/66 |
| 5,426,566 | 6/1995 | Beilstein, Jr. | 361/735 |

FOREIGN PATENT DOCUMENTS

| | | |
|---|---|---|
| 63-300589 | 12/1988 | Japan . |
| 3-38084 | 2/1991 | Japan . |
| 1443338 | 7/1976 | United Kingdom . |
| 2250138 | 5/1992 | United Kingdom . |

OTHER PUBLICATIONS

IBM Technical Disclosure, Hinkley et al., vol. 9, No. 7, p. 765, Dec. 1966.

*Primary Examiner*—Neil Abrams
*Attorney, Agent, or Firm*—Richard C. Litman

[57] ABSTRACT

A z-interface-board includes an array of vias or holes for interconnecting z-plane modules with other electronic components. The vias are plated with an electrically conductive material to create conductive elements or connecting contacts on both sides of the board. The plating can be manipulated to form different contact configurations at the vias. Different types of tops for the vias on one side of the board may be used for mating with other electronic components. Different types of bottoms for the vias on the other side of the board may be used for mounting the interface board to the z-plane module. The interface board provides a flat wafer-like surface for allowing process development including indium bump bonding. After the process development, the interface board is mounted to a stacked z-plane module. This final mounting may be performed by hard solder bumps or pins, instead of the soft indium bumps.

10 Claims, 2 Drawing Sheets

Z-INTERFACE-BOARD

BACKGROUND OF THE INVENTION

1. Field of the Invention

The present invention relates to an intermediate z-interface-board to accept development processes, such as bump bonding an infrared focal plane array (FPA) onto a stacked electronic modules.

2. Description of the Prior Art

Substrates such as multiple silicon chips or ceramic boards may be stacked and integrated using z-technology concepts to achieve modules with a high density of electronic circuitry. In this way, electronic circuits are constructed within a three dimensional framework, which includes the z-direction. Z-plane modules may be used for such applications as visible and infrared focal plane arrays (FDA), computer memory modules and infrared image simulation.

For example, in a FPA, z-plane modules perform signal processing functions on the outputs of a detector element array. The chip substrates are set along the z-axis with exposed electrical leads in order to allow the signal processing circuitry or detector arrays to be mounted on the module. The detector array is often bump bonded onto the z-module. The detectors may also be bonded onto each board, or a small assembly of boards, before stacking and gluing the boards into a large array of detectors. However, it is very difficult to perform such process development as indium bump formation and bonding on the edge of a board. Conventional semiconductor processing equipment is constructed to handle flat surfaces such as wafers, not the bulky cubes or tall boards formed by z-plane stacking techniques. There exists a need in the art to provide a flat wafer-like surface to accept conventional process development methods such as photoprocessing i.e., photoresist masking, and indium bump bonding for a z-plane module.

The following patents mostly describe the construction of prior devices using concepts based on the z-plane. None of the patents either address or appreciate the need for performing process development on a flat wafer-like surface instead of the edges of the substrate in a z-plane module when using conventional semiconductor processing equipment.

U.S. Pat. No. 5,111,050 issued to Nevil Q. Maassen et al. on May 5, 1992, describes a radiation detector assembly with a monolithic FPA platform comprised of an A1N material because of its thermal contraction characteristics.

U.S. Pat. No. 5,104,820 issued to Tiong C. Go et al. on Apr. 14, 1992, describes using selective etching to adapt readily available IC wafers for stacking. Go et al. also describe metallization techniques for forming electrical contacts on the access plane of the stack.

U.S. Pat. No. 5,092,036 issued to William C. Hu et al. on Mar. 3, 1992, describes an interconnect pad for microcircuitry having an array of ultra-tall indium bump columns. The pad contains an array of metal tubes which extend from each side of the pad. The pad is immersed in molten indium which fills the tubes. The pad is then mated with indium bumps on a chip. Pressure is applied to cold weld the indium filled tubes to the indium bumps.

U.S. Pat. No. 5,075,238 issued to Allen L. Solomon on Dec. 24, 1991, describes a method for constructing an infrared detector array directly upon a detector interface device. The crystalline film of the detector is formed on a substrate to form a thermally stable interface between the detector elements and the z-stacked modules.

U.S. Pat. No. 5,072,331 issued to Alan G. Thiele et al. on Dec. 10, 1991, describes a secure circuit structure comprising a pair of opposed substrates that are indium bump bonded.

U.S. Pat. No. 5,015,858 issued to Frank L. Augustine et al. on May 14, 1991, describes a focal point array having an interconnect bump of high thermal resistivity to interconnect the detector and the readout of the array. Perforating transverse vias are used to increase the thermal resistance of the bump. The detector and readout are connected by conventional indium bumps.

U.S. Pat. No. 4,706,166 issued to Tiong C. Go on Nov. 10, 1987, describes forming indium bonding bumps at appropriate points on the access plane of a stack of chips to allow for electrical bonding by matching bumps on the access plane to those on a corresponding substrate surface.

U.S. Pat. No. 4,672,737 issued to John C. Carson et al. on Jun. 16, 1987, describes depositing a passivation layer on the access plane of a stack of semiconductor chips with integrated circuitry, and then lapping the edge of the chips in order to uncover the electrical leads to allow for the placement of photo-detectors along the access plane. It should be noted that U.S. Pat. Nos. 4,672,737, 4,646,128, 4,551,629 and 4,525,921 are all related sibling applications.

U.S. Pat. No. 4,646,128 issued to John C. Carson et al. on Feb. 24, 1987, also describes depositing a passivation layer on the access plane of a stack of semiconductor chips with integrated circuitry, and then lapping the edge of the chips in order to uncover the electrical leads. Thin filmed metallization is performed on the access plane to make electrical connection with the contact points formed as part of the integrated circuitry on the substrates.

U.S. Pat. No. 4,617,160 issued to Robert J. Belanger et al. on Oct. 14, 1986, describes forming stacks of thin circuitry-carrying layers by exerting pressure on a set of aligned chips and epoxy. A thermo-setting adhesive applied between the layers is cured while the stacked chips are set within a fixed-size cavity.

U.S. Pat. No. 4,551,629 issued to John C. Carson et al. on Nov. 5, 1985, describes depositing a passivation layer on the access plane, and then lapping the edge of the chips in order to uncover the metal leads to allow for the placement of photodetectors along the access plane.

U.S. Pat. No. 4,525,921 issued to John C. Carson et al. on Jul. 2, 1985, also describes depositing a passivation layer on the access plane, and then lapping the edge of the chips in order to uncover the metal leads. Metallization is performed on the access plane to contact the appropriate leads on the access plane.

Japanese Kokai No. 03-38084 filed by Sharp Corp. for Yamamura and published on Feb. 19, 1991, describes using conductive particles to achieve a stable connection between electrodes on circuit boards by pressing together bump electrodes on corresponding circuit boards.

Japanese Kokai No. 63-300589 filed by Sharp Corp. for Hosokawa and published on Dec. 7, 1988, describes a multi-layer memory structure in which additional memory can be connected by stacking additional memory substrates to terminals on the substrates.

GB application No. 2,250,138 filed by American Telephone and Telegraph Company for Wayne H. Miller and published on May 27, 1992, describes an arrangement by which individual circuits are routed within a parallel stack of circuit boards by providing staggered terminals on the circuit boards. Circuits routed through these terminals are shifted in position at each layer in the stack.

GB specification No. 1,443,338 filed by Bunker Ramo Corporation for Howard Lee Parks and published on Jul. 21, 1992, describes a method of fabricating a plurality of spaced, electrically insulated through-connections in a predetermined pattern in a conductive sheet by precision stamping. The reference is directed towards stacking and interconnecting wafers in the direction, and not towards interfacing a z-plane module with other electronic components.

While these and other patents disclose circuitry modules using concepts of z-technology, the known prior art does not disclose or suggest the use of the interface board of the present invention to adapt conventional semiconductor processing equipment for use with z-plane modules. For example, none described using an interface board to accept processing such as photoprocessing and indium bump bonding for a stacked z-plane module. None of the above patent references, either alone or in combination with one another, is seen to describe the instant invention as claimed.

SUMMARY OF THE INVENTION

An advantage of the invention is to overcome the foregoing difficulties and shortcomings involved in processing and connecting z-plane modules to other operational elements.

Another advantage of the invention is to provide a flat wafer-like surface for accepting process development including indium bump bonding for a stacked z-plane module using conventional semiconductor processing equipment.

A further advantage of the invention is to provide a secure and effective interface between a stacked z-plane module and a mosaic array of infrared detectors.

To achieve these and other advantages of the invention and in accordance with the purpose of the invention, as embodied and broadly described herein, a preferred embodiment of the invention comprises a sheet having a first surface and a second surface, and further including a plurality of vias or holes extending through the sheet from the first surface to the second surface, wherein the vias are plated with an electrically conductive material to form individual electrically conductive elements terminating on the first and second sides of the sheet; and wherein said first surface is substantially flat. The vias have a diameter of between 1 mil and 10 mils, and are spaced between 2 mils and 20 mils apart. The vias on said first surface may include bump bonds or circuit elements. The vias on said second surface may include such surface configurations as indentations, bonding bumps, and prongs.

These and other advantages of the present invention will become readily apparent upon further review of the following specification and drawings.

DETAILED DESCRIPTION OF THE PREFERRED EMBODIMENTS

Referring now to the accompanying drawings, a preferred embodiment of the present invention is illustrated. None of the disclosed embodiments should be construed as limiting the scope of the present invention. The illustrated embodiment, which is exemplary in nature, shows a preferred application of the present invention to interconnect an infrared detector array with a z-plane module. Other preferred applications are further described in the specification.

Figure 1:
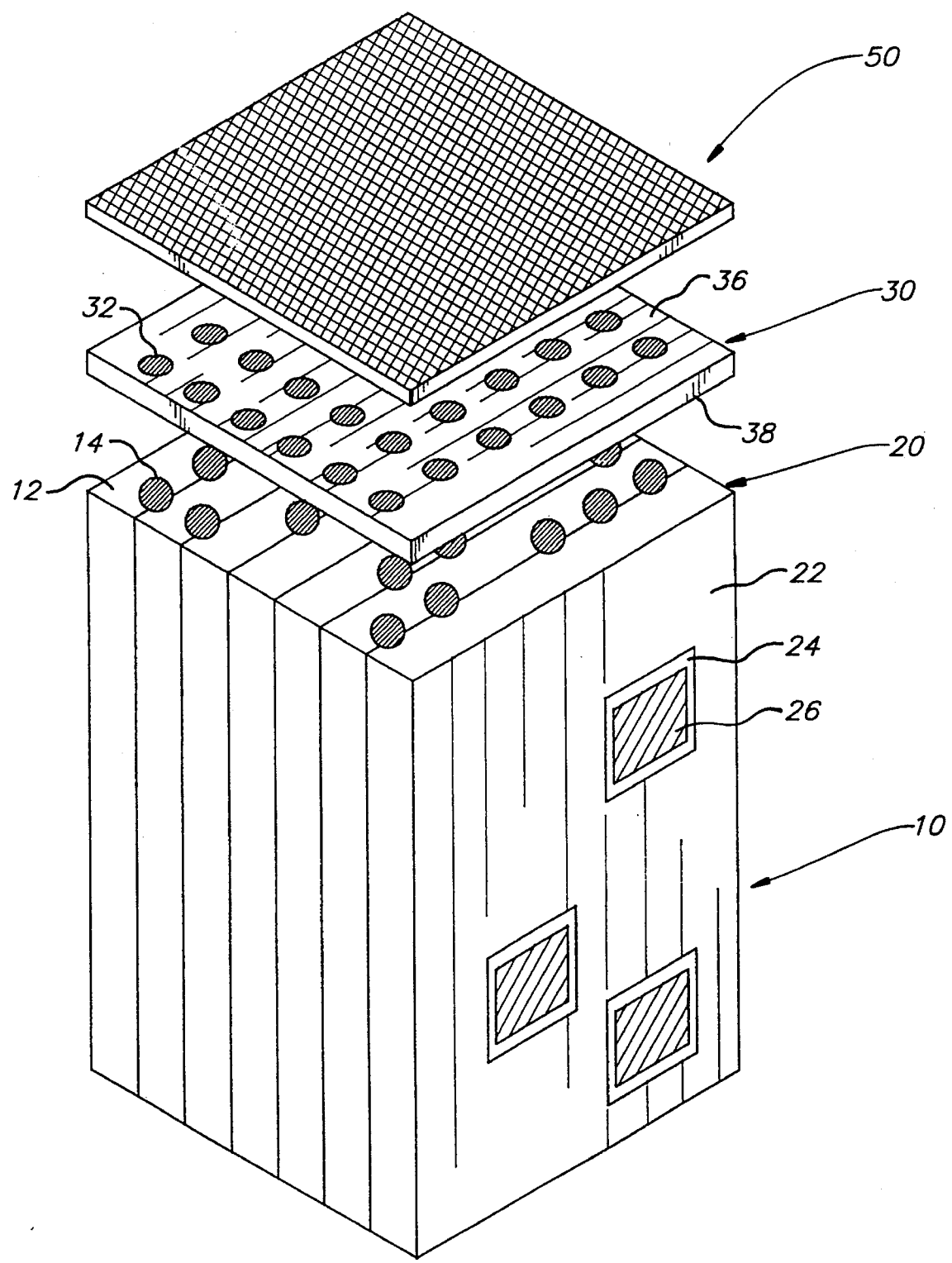
FIG. 1 is an exploded perspective view of a preferred embodiment of the z-interface-board sandwiched between a detector mosaic array and a z-plane module according to the present invention.

As shown in FIG. 1, module 10 includes a multitude of layers 20 stacked in the z-direction. Module 10 is a stack of substrate layers 20 affixed together by a suitable adhesive material such as epoxy applied between the adjacent substrates 20. Each layer 20 is a ceramic board with metallized electrical leads 22 and holes 24. Integrated circuit chips 26 can be embedded in the holes 24 in the board 20 and then can be electrically bonded to leads 22. The chips 26 are of varying sizes and may traverse several boards 20 through holes 24. Module 10 may typically consist of 8 to 512 ceramic boards 20. It is noted that in place of ceramic boards with IC chips embedded therein, a series of silicon chips with integrated circuitry may be stacked together to form a z-plane module.

Module 10 includes electrical contacts 14 on top surface 12 for mating with detector array 50, which is preferably an infrared detector mosaic array, through z-interface-board 30. The processing circuitry of module 10 can identify sources of infrared radiation by analyzing the outputs of the detector elements on array 50. The detector elements are found on one side of array 50, and the outputs of the detector elements are found on the opposite side of said detector array. Array 50 may include thousands of detector elements, with up to 1024 detector elements on a side. Considerable difficulties can occur in electrically connecting the detector elements to associated signal processing circuitry, especially in providing structures that adequately interface large numbers of detector elements with the associated densely packed circuitry in a practical and reliable manner.

Z-interface-board 30 is preferably 15 mils thick and is constructed from a nonconductive material such as ceramic. Other acceptable materials for interface board 30 include silicon, glass, sapphire and plastic. Top surface 12 of module 10 mates with the bottom side 38 of interface board 30, and detector array 50 is matched with the top side 36. Top surface 12 includes a set of metallized pads 14 to connect with the array of filled vias 32 on the bottom side 38 of interface board 30. Interface board 30 may be securely mated with the module by hard solder bumps or pins, as opposed to the soft indium bumps for bonding to a delicate detector array 50. Array 50 preferably includes indium bumps (not shown) on the underside for indium bump bonding with corresponding indium bumps formed atop vias 32 in interface board 30.

Figure 2:
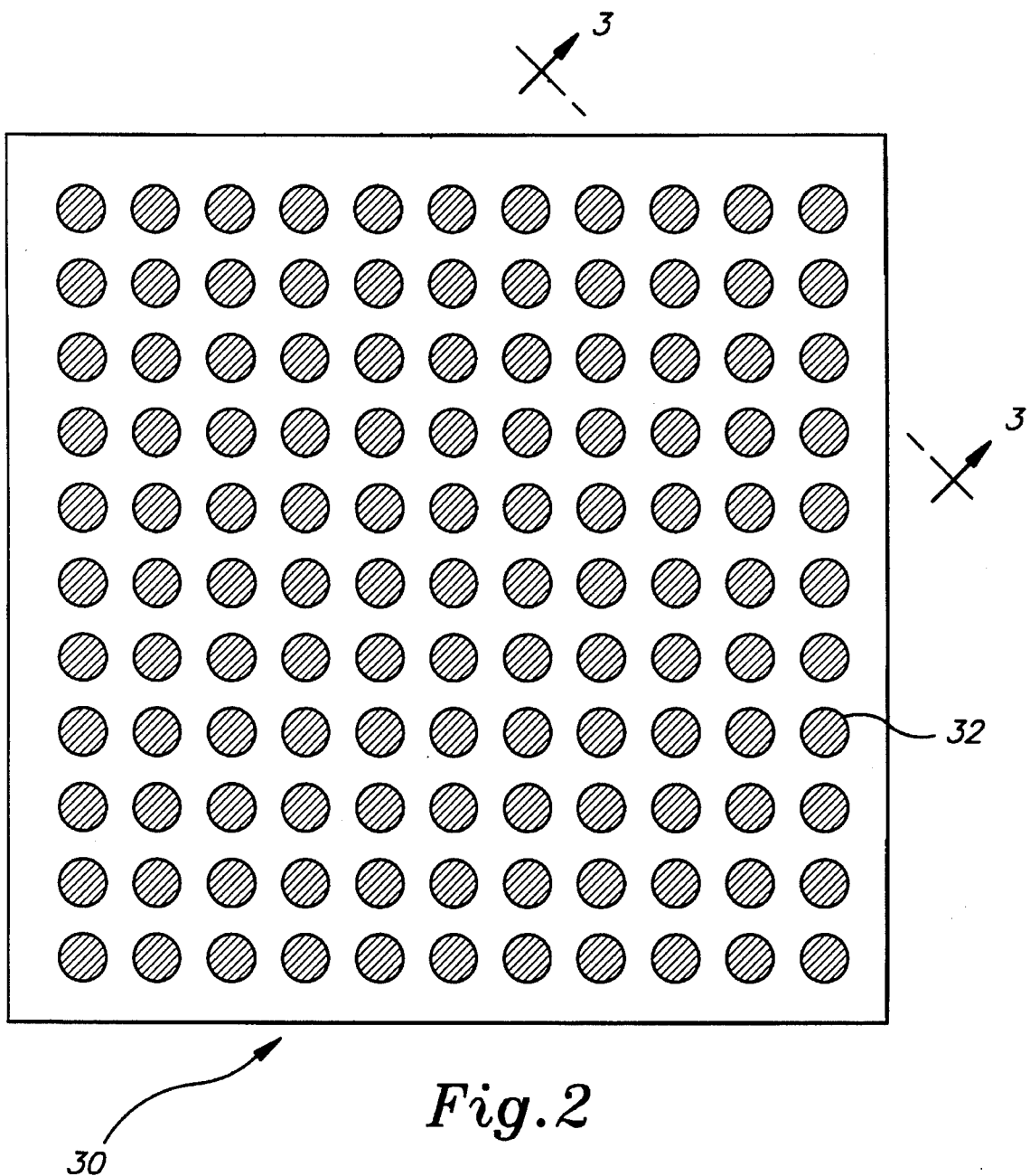
FIG. 2 is a top view of a preferred embodiment of the z-interface-board in accordance with the present invention.

As shown in FIG. 2, interface board 30 includes an x-y array of closely spaced holes or vias 32 formed therein. Vias 32 run through the thickness of interface board 30, and may be of any suitable size or shape. Depending on the type of module or element to be interconnected, the size of vias 32 typically would range from 1 mil to 10 mils in diameter. The spacing of vias 32 in interface board 30 would typically range from 2 mils to. 20 mils center to center. For example, in connecting the array 50 to z-plane module 10, vias 32 would preferably be in the range of 1 mil to 4 mils in diameter, and the array of vias 32 in interface board 30 would preferably be spaced 2 mils to 10 mils apart, center to center. It is understood that these ranges are exemplary, and that the exact specifications would be dependant on factors such as the types of modules and circuit components to be interfaced together. Vias 32 may be created in interface board 30 using a laser or any suitable photoprocessing technique.

Vias 32 are preferably filled in with conductive plating 40. Vias 32 are plated with an electrical conductor such as tantalum, tungsten or gold. Other acceptable electrical conductors include copper, indium, aluminum, chrome alloys (e.g., CrAu), nickel, and solder. If vias 32 were sized on the order of 10 mils or larger, the plating 40 would plate the sides of the vias 32, but may not completely fill in the vias 32. Plating 40 can be manipulated to form different surface configurations at the opposite top and bottom openings of vias 32. The plating of vias 32 may be accomplished by a solder plating operation and such deposition techniques as photoresist masking processing, evaporation or sputtering. The plated surface configurations may be formed by applying a photoresist mask film to interface board 30 before subjecting the board to a solder bath.

Figure 3:
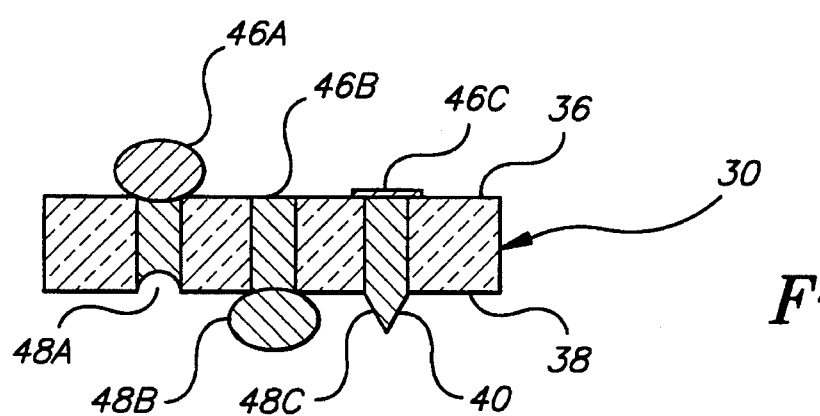
FIG. 3 is side view of a preferred embodiment of the interface board taken along lines 3—3 in FIG. 2 showing multiple plated vias in accordance with the present invention.

As illustrated in FIG. 3, different types of top configurations 46 for vias 32 may be fabricated on one side 36 of interface board 30 for mating with other electronic components. Different types of bottom configurations or terminations 48 for vias 32 on the other side 38 of interface board 30 may be used for mounting interface board 30 onto the z-plane module 10. FIG. 3 illustrates three separate top configurations 46A, 46B and 46C, and three separate bottom configurations 48A, 48B and 48C. Surface configurations 46 and 48 may either be formed during the initial plating process, or separately afterwards by another deposition process such as sputtering or evaporation. The different surface configurations 46 and 48 may be used independent of one another, or in any appropriate combination contingent upon the types of circuitry and electronic elements to be interconnected.

The surfaces of vias 32 on the top side 36 of interface board 30 should be substantially flat in order to accommodate conventional process development, including photoresist and evaporation techniques. For example, indium bumps 46A may be cast atop the plating 40 of vias 32. These indium bumps 46A may be bonded with indium bumps formed on the underside of the detector array 50. In place of the soft indium bumps, hard solder bumps may be used to bond electronic elements to interface board 30. Some via surfaces 46 may remain flat and unprocessed as indicated by reference numeral 46B. Other types of contact pads 46B may be formed atop vias 32 by vacuum deposition techniques such as evaporation to properly bond with a variety of electronic elements. Top 46C could also be an electronic component that is applied directly onto the vias 32 of interface board 30. For example, top 46C could be a heater element or another type of resistive circuit element formed directly on top of interface board 30.

Bottom configurations or terminations 48A, 48B and 48C may be formed to interact with a variety of contacts that may be found on module 10. Suitable contacts 14 include metallized pads, metallized indentations, and indium bumps. Bottom 48A is shaped as an indentation which can act as the female connector in a male-female bonding scheme. Bottom 48B is a ball bond or bump for soldering or bump bonding to module 10. Bottom 48B may be either a hard solder bump or an indium bump for more delicate work. Soldering is preferred as a more secure method of bonding where the delicacy of an indium bump bonding process is not required. Bottom 48B may be formed as part of the initial plating process, but may also be formed separately by another deposition process such as evaporation. Bottom 48C is shaped as a prong 40 which can connect with contacts and recesses formed on surface 12 of module 10. An array of vias 32 with bottom 48C could be pictured as a two-dimensional array of prongs to be plugged into a stacked cube, module 10. The surface configurations of vias 32 may be accomplished by such operations as solder plating or and photoresist masking.

It is to be understood that the present invention is not limited to the exemplary embodiments described above. The size and shape of the vias may be modified to interact with different chip modules and board elements. For example, the vias could be larger and more rectangular if circuit elements such as heater elements were to be formed directly on the interface board instead of an infrared detector array being mounted onto the board. It will be apparent to those skilled in the art that various modifications and variations are possible within the spirit and scope of the present invention. The present invention encompasses any and all embodiments within the scope of the following claims.

I claim:

1. An interface board system for interconnecting an infrared detector mosaic array with a z-plane module comprising:

an infrared detector mosaic array including a plurality of infrared detector elements on one side of said detector array and a plurality of detector element outputs on an opposite side of said infrared detector mosaic array;

a z-interface board having a first surface and a second surface for interconnecting said infrared detector mosaic array with a z-module and consisting of a substantially non-conductive sheet material selected from the group consisting of ceramic, silicon, glass, sapphire, and plastic;

said z-interface board including a plurality of vias extending through from said first surface to said second surface, wherein said vias range in diameter between 1 mil and 4 mils, range in spacing between 2 mils and 10 mils apart, center to center, and said z-interface board being approximately 15 mils thick;

said vias filled with an electrically conductive material selected from the group consisting of tantalum, tungsten and gold to form individual electrically conductive elements terminating at each of said first and second surfaces of said z-interface board to form a corresponding mosaic array of conductive elements; and said first surface being substantially flat and mating electrically with said infrared detector mosaic array, and said second surface containing terminations of said individual electrically conductive elements which mate electrically with the individual electrically conductive elements at the ends of multiple substrate layers stacked in the z-direction of said z-plane module, thereby interconnecting said infrared detector mosaic array with said z-plane module.

2. An interface board according claim 1, wherein said terminations of said conductive elements on said second surface further include indentations for female connectors.

3. An interface board according to claim 1, wherein said conductive elements on said second surface further include bonding pins.

4. An interface board according to claim 1, wherein said terminations of conductive element on said second surface further include prongs.

5. An interface board according to claim 1, wherein said termination of said conductive elements on said second surface further include hard solder bumps.

6. An interface board according to claim 1, wherein said terminations of conductive elements on said first surface further include resistors.

7. An interface board according to claim 1, wherein said z-interface board is composed of a ceramic.

8. An interface board according to claim 1, wherein said terminations of conductive elements on said on said first surface further include flat surfaces.

9. An interface board according to claim 1, wherein said terminations of conductive elements on said first surface further include soft indium bumps.

10. An interface board according to claim 1, wherein said terminations of said conductive elements on said first surface further include heaters.

* * * * *